US008617933B2

(12) United States Patent
Camacho et al.

(10) Patent No.: US 8,617,933 B2
(45) Date of Patent: Dec. 31, 2013

(54) INTEGRATED CIRCUIT PACKAGING SYSTEM WITH INTERLOCK AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG); Dioscoro A. Merilo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 328 days.

(21) Appl. No.: 13/118,214

(22) Filed: May 27, 2011

(65) Prior Publication Data

US 2012/0299196 A1    Nov. 29, 2012

(51) Int. Cl.
*H01L 21/44* (2006.01)
*H01L 21/48* (2006.01)

(52) U.S. Cl.
USPC ........... 438/123; 438/124; 438/127; 438/617; 257/E21.51; 257/E21.502; 257/E23.031

(58) Field of Classification Search
USPC ................. 438/123, 124, 127, 617, E21.51, 438/E21.509; 257/676, E23.031
See application file for complete search history.

(56) References Cited

U.S. PATENT DOCUMENTS

| | | | |
|---|---|---|---|
| 6,143,981 A * | 11/2000 | Glenn | 174/534 |
| 6,261,864 B1 | 7/2001 | Jung et al. | |
| 6,342,730 B1 | 1/2002 | Jung et al. | |
| 6,684,496 B2 * | 2/2004 | Glenn | 29/841 |
| 6,927,086 B2 * | 8/2005 | Hazlett | 438/28 |
| 6,969,905 B2 | 11/2005 | Paulus | |
| 7,049,177 B1 | 5/2006 | Fan et al. | |
| 7,247,938 B2 | 7/2007 | Groenhuis et al. | |
| 7,332,375 B1 * | 2/2008 | Glenn | 438/123 |
| 7,378,300 B2 * | 5/2008 | Marimuthu et al. | 438/124 |
| 2002/0031869 A1 * | 3/2002 | Minamio et al. | 438/127 |
| 2007/0181983 A1 | 8/2007 | Takai et al. | |
| 2009/0032943 A1 * | 2/2009 | Shoji et al. | 257/737 |
| 2011/0233752 A1 * | 9/2011 | Camacho et al. | 257/692 |
| 2012/0018866 A1 * | 1/2012 | Camacho et al. | 257/676 |
| 2012/0153449 A1 * | 6/2012 | Chou | 257/676 |
| 2013/0009297 A1 * | 1/2013 | Tsui et al. | 257/676 |

OTHER PUBLICATIONS

U.S. Appl. No. 12/890,491, filed Sep. 24, 2010, Camacho et al.

* cited by examiner

*Primary Examiner* — Nitin Parekh
(74) *Attorney, Agent, or Firm* — Ishimaru & Associates LLP; I-Chang John Yang

(57) ABSTRACT

A method of manufacture of an integrated circuit packaging system includes: forming a lead having a lead overhang at an obtuse angle to a lead top side and having a lead ridge protruding from a lead non-horizontal side, the lead overhang having a lead overhang-undercut side at an acute angle to a lead overhang non-horizontal side; forming a lead conductive cap completely covering the lead overhang non-horizontal side and the lead top side; forming a package paddle adjacent the lead; mounting an integrated circuit over the package paddle; and forming an encapsulation over the integrated circuit, the package paddle, and the lead.

3 Claims, 4 Drawing Sheets

INTEGRATED CIRCUIT PACKAGING SYSTEM WITH INTERLOCK AND METHOD OF MANUFACTURE THEREOF

TECHNICAL FIELD

The present invention relates generally to an integrated circuit packaging system, and more particularly to a system for an integrated circuit packaging system with encapsulation.

BACKGROUND ART

Semiconductor chips have become progressively more complex, driven in large part by the need for increasing processing power. Increase in power is needed in a smaller chip size for compact or portable electronic devices, such as cell phones, smart phones, personal media systems, and ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps, or other suitable electrical connections.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. It may also be desirable to formulate a packaging process designed to meet these objectives. Current packaging solutions can meet some of these objectives but may not be able to meet most, or all, of these objectives.

Thus, a need still remains for increased density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having a lead overhang at an obtuse angle to a lead top side and having a lead ridge protruding from a lead non-horizontal side, the lead overhang having a lead overhang-undercut side at an acute angle to a lead overhang non-horizontal side; forming a lead conductive cap completely covering the lead overhang non-horizontal side and the lead top side; forming a package paddle adjacent the lead; mounting an integrated circuit over the package paddle; and forming an encapsulation over the integrated circuit, the package paddle, and the lead.

The present invention provides an integrated circuit packaging system including: a lead having a lead overhang at an obtuse angle to a lead top side and having a lead ridge protruding from a lead non-horizontal side, the lead overhang having a lead overhang-undercut side at an acute angle to a lead overhang non-horizontal side; a lead conductive cap completely covering the lead overhang non-horizontal side and the lead top side; a package paddle adjacent the lead; an integrated circuit over the package paddle; and an encapsulation over the integrated circuit, the package paddle, and the lead.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
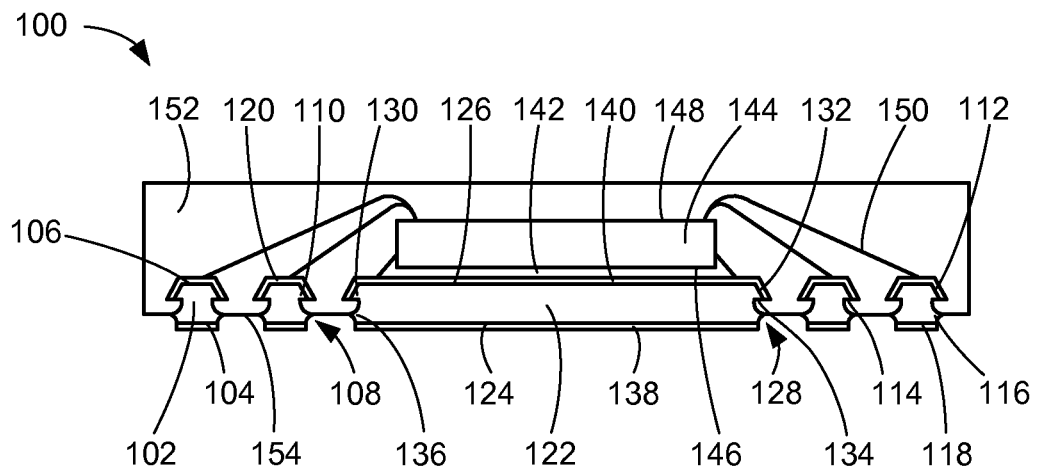
FIG. 1 is a cross-sectional view of an integrated circuit packaging system taken along line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Problems of lead pull out are common in quad flat nolead sawn stand-off (QFNs-st) or quad flat nolead sawn stand-off multiple row (QFNs-st-mr) package designs. Problems also occur with lead pull strength being weak for stand-off quad flat nolead (QFN) packages. Embodiments of the present invention provide answers or solutions to the problems.

Figure 2:
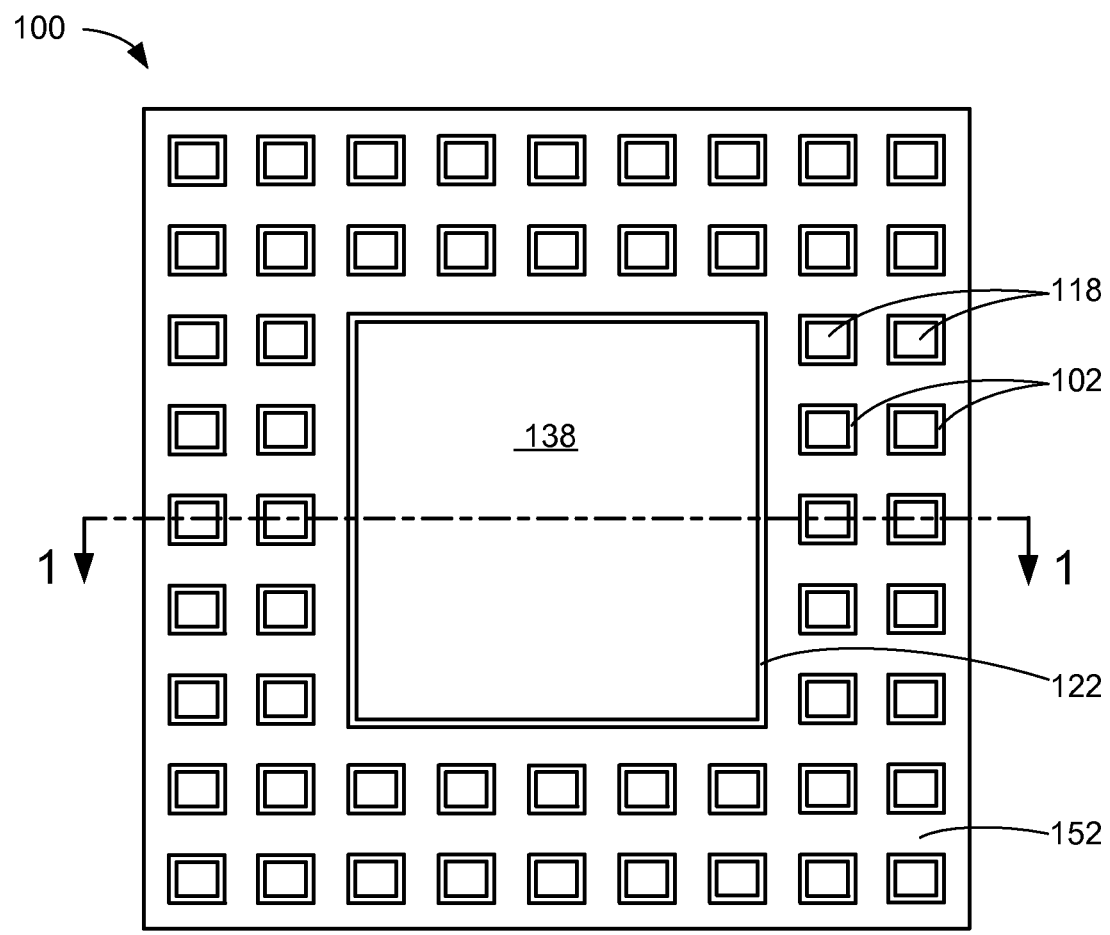
FIG. 2 is a bottom view of the integrated circuit packaging system.

Referring now to FIG. 1, therein is shown a cross-sectional view of an integrated circuit packaging system 100 taken along line 1-1 of FIG. 2 in an embodiment of the present invention. The integrated circuit packaging system 100 can include a super lead interlock quad flat nolead sawn multiple row (QFNs-mr) package. The integrated circuit packaging system 100 can include a stand-off quad flat nolead (QFN) package with robust lead interlocking.

The integrated circuit packaging system 100 can include a lead 102, which is defined as a conductive structure that provides connectivity for an electrical signal or an electrical potential level between the integrated circuit packaging system 100 and an external system (not shown). The lead 102 can include a lead bottom side 104 and a lead top side 106 opposite to the lead bottom side 104. The lead bottom side 104 and the lead top side 106 are a lower horizontal surface and an upper horizontal surface, respectively, of the lead 102.

The lead 102 can include a lead non-horizontal side 108, which is defined as a lateral side of the lead 102. The lead non-horizontal side 108 extends between the lead bottom side 104 and the lead top side 106.

The lead 102 can include a lead overhang 110, which is defined as a lateral protrusion of the lead 102. The lead overhang 110 laterally protrudes from the lead non-horizontal side 108.

The lead overhang 110 can include a lead overhang non-horizontal side 112, which is defined as a lateral side of the lead overhang 110. The lead overhang non-horizontal side 112 can be formed at an obtuse angle to the lead top side 106.

The lead overhang 110 can include a lead overhang-undercut side 114, which is defined as a lower side of the lead overhang 110. The lead overhang-undercut side 114 can be at an acute angle to the lead overhang non-horizontal side 112.

The lead overhang non-horizontal side 112 can be between the lead top side 106 and the lead overhang-undercut side 114.

The lead 102 can include a lead ridge 116, which is defined as another lateral protrusion of the lead 102. The lead ridge 116 laterally protrudes from the lead non-horizontal side 108. The lead ridge 116 can be formed between the lead bottom side 104 and the lead overhang 110.

The lead ridge 116 can be formed by non-planar surfaces at lower and upper sides of the lead ridge 116. For example, the lower and upper sides of the lead ridge 116 can include curve surfaces. For a specific example, the lower and upper sides of the lead ridge 116 can include concave surfaces.

The integrated circuit packaging system 100 can include a lead conductive layer 118, which is defined as an attachment site providing electrical connection to the lead 102. The lead conductive layer 118 can be formed directly on the lead bottom side 104.

The integrated circuit packaging system 100 can include a lead conductive cap 120, which is defined as a structure that covers a top portion of the lead 102 and provides electrical connectivity between a semiconductor device and the lead 102. The lead conductive cap 120 completely covers the lead top side 106 and completely covers the lead overhang non-horizontal side 112. The lead conductive cap 120 can be formed directly on the lead top side 106 and the lead overhang non-horizontal side 112.

The integrated circuit packaging system 100 can include a package paddle 122, which is defined as a support structure for mounting or attaching a semiconductor device thereon. The package paddle 122 can be adjacent the lead 102.

The package paddle 122 can include a paddle bottom side 124 and a paddle top side 126 opposite to the paddle bottom side 124. The paddle bottom side 124 and the paddle top side 126 are defined as a lower horizontal surface and an upper horizontal surface, respectively, of the package paddle 122.

The package paddle 122 can include a paddle non-horizontal side 128, which is defined as a lateral side of the package paddle 122. The paddle non-horizontal side 128 extends between the paddle bottom side 124 and the paddle top side 126.

The package paddle 122 can include a paddle overhang 130, which is defined as a lateral protrusion of the package paddle 122. The paddle overhang 130 laterally protrudes from the paddle non-horizontal side 128.

The paddle overhang 130 can include a paddle overhang non-horizontal side 132, which is defined as a lateral side of the paddle overhang 130. The paddle overhang non-horizontal side 132 can be formed at an obtuse angle to the paddle top side 126.

The paddle overhang 130 can include a paddle overhang-undercut side 134, which is defined as a lower side of the paddle overhang 130. The paddle overhang-undercut side 134 can be at an acute angle to the paddle overhang non-horizontal side 132.

The paddle overhang non-horizontal side 132 can be between the paddle top side 126 and the paddle overhang-undercut side 134. A plane of a portion of the lead overhang-undercut side 114 can be coplanar with a plane of a portion of the paddle overhang-undercut side 134.

The package paddle 122 can include a paddle ridge 136, which is defined as another lateral protrusion of the package paddle 122. The paddle ridge 136 laterally protrudes from the paddle non-horizontal side 128. The paddle ridge 136 can be formed between the paddle bottom side 124 and the paddle overhang 130.

The paddle ridge 136 can be formed by non-planar surfaces at lower and upper sides of the paddle ridge 136. For example, the lower and upper sides of the paddle ridge 136 can include curve surfaces. For a specific example, the lower and upper sides of the paddle ridge 136 can include concave surfaces.

The integrated circuit packaging system 100 can include a paddle conductive layer 138, which is defined as an attachment site providing electrical connection to the package paddle 122. The paddle conductive layer 138 can be formed directly on the paddle bottom side 124.

The integrated circuit packaging system 100 can include a paddle conductive cap 140, which is defined as a structure that covers a top portion of the package paddle 122 and provides a mounting support for a semiconductor device. The paddle conductive cap 140 completely covers the paddle top side 126 and completely covers the paddle overhang non-horizontal side 132. The paddle conductive cap 140 can be formed directly on the paddle top side 126 and the paddle overhang non-horizontal side 132.

The integrated circuit packaging system 100 can include an attach layer 142, which is defined as a structure for holding a semiconductor device to a support structure. The integrated circuit packaging system 100 can include an integrated circuit 144, which is defined as a semiconductor device having a number of integrated transistors interconnected to form active circuits.

The integrated circuit 144 can be mounted over the paddle conductive cap 140 and the package paddle 122. The integrated circuit 144 can include an inactive side 146 and an active side 148 opposite the inactive side 146. The inactive side 146 can be attached to the paddle conductive cap 140 with the attach layer 142.

The integrated circuit packaging system 100 can include an electrical connector 150, which is defined as an electrically conductive connector. The electrical connector 150 can be electrically connected or attached to the lead conductive cap 120 and the active side 148.

The integrated circuit packaging system 100 can include an encapsulation 152, which is defined as a package cover of a semiconductor package to seal a semiconductor device providing mechanical and environmental protection. The encapsulation 152 can be formed over or on an upper portion of the lead ridge 116, the lead conductive cap 120, an upper portion of the paddle ridge 136, and the paddle conductive cap 140.

The encapsulation 152 can partially expose bottom portions of the lead 102 and the package paddle 122. The encapsulation 152 can expose the lead conductive layer 118 and the paddle conductive layer 138.

The encapsulation 152 can include an encapsulation bottom side 154, which is defined as a lower extent of the encapsulation 152. Bottom portions of the lead 102 and the package paddle 122 can protrude from the encapsulation bottom side 154. The lead conductive layer 118 and the paddle conductive layer 138 can be below the encapsulation bottom side 154.

It has been discovered that the lead conductive cap 120 provides the lead 102 having a robust lead interlock shape, shown as the lead overhang-undercut side 114, with the lead conductive cap 120 completely covering the lead top side 106 and the lead overhang non-horizontal side 112 and with the encapsulation 152 directly on and under the lead overhang-undercut side 114 thereby preventing lead pullouts.

It has also been discovered that the paddle conductive cap 140 provides the package paddle 122 having a robust paddle interlock shape, shown as the paddle overhang-undercut side 134, with the paddle conductive cap 140 completely covering the paddle top side 126 and the paddle overhang non-horizontal side 132 and with the encapsulation 152 directly on and under the paddle overhang-undercut side 134 thereby preventing paddle pullouts.

It has been unexpectedly found that the lead conductive cap 120 completely extending over the lead overhang 110 provides more area for attachment of the electrical connector 150 thereby resulting in improved yield.

It has also been unexpectedly found that the paddle conductive cap 140 completely extending over the paddle overhang 130 provides more area for attachment of the integrated circuit 144 thereby resulting in improved yield.

It has been unexpectedly determined that the lead ridge 116 and the paddle ridge 136 provide mold interlock improvement such that the lead 102 and the package paddle 122, respectively, adhere to the encapsulation 152 thereby eliminating paddle and lead pullouts.

It has been unexpectedly recognized that the lead overhang 110 and the paddle overhang 130 laterally extending from the lead non-horizontal side 108 and the paddle non-horizontal side 128, respectively, improve reliability by providing increase in surface areas for attaching the lead conductive cap 120 and the paddle conductive cap 140, respectively, thereby eliminating peeling of the lead conductive cap 120 and the paddle conductive cap 140 during board level reliability (BLR) and drop tests.

It has been unexpectedly ascertained that bottom portions of the lead 102 and the package paddle 122 protruding from and electrically isolated at the encapsulation bottom side 154 eliminate electrical short problems between the lead 102 and another of the lead 102 and between the package paddle 122 and the lead 102 by providing the lead conductive layer 118 and the paddle conductive layer 138 below the encapsulation bottom side 154.

Referring now to FIG. 2, therein is shown a bottom view of the integrated circuit packaging system 100. The bottom view depicts a peripheral array of a number of the lead 102. The peripheral array can surround the package paddle 122. Portions of the lead 102 and the package paddle 122 can be exposed from the encapsulation 152.

The lead conductive layer 118 can include a perimeter smaller than a perimeter of the lead 102. The lead conductive layer 118 can include a center concentric with a center of the lead 102. The paddle conductive layer 138 can include a perimeter within a perimeter of the package paddle 122.

For illustration purposes, the lead 102, the lead conductive layer 118, the package paddle 122, and the paddle conductive layer 138 are shown with structures having rectangular shapes, although it is understood that the lead 102, the lead conductive layer 118, the package paddle 122, and the paddle conductive layer 138 can include structures having any shapes. For example, the lead 102, the lead conductive layer 118, the package paddle 122, and the paddle conductive layer 138 can include circular or square shapes.

Figure 3:
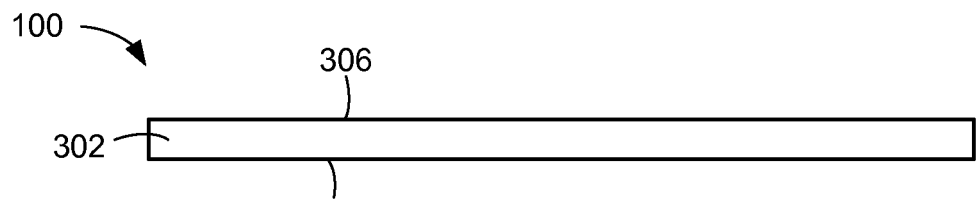
FIG. 3 is a cross-sectional view of the integrated circuit packaging system in a carrier-providing phase of manufacture.

Referring now to FIG. 3, therein is shown a cross-sectional view of the integrated circuit packaging system 100 in a carrier-providing phase of manufacture. The integrated circuit packaging system 100 can include a carrier 302, which is defined as a conductive material. The carrier 302 can include a conductive material including copper (Cu). The carrier 302 can include a carrier bottom side 304 and a carrier top side 306.

For example, the carrier 302 can represent a leadframe, a conductive strip, a conductive sheet, a conductive panel, or a bare material. For a specific example, the carrier 302 can represent a bare copper (Cu) strip or a leadframe for stand-off quad flat nolead (QFN) package.

Figure 4:
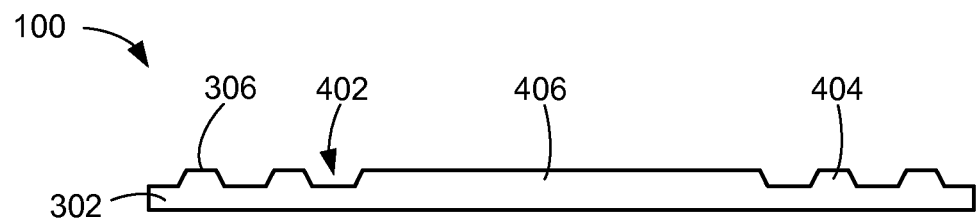
FIG. 4 is the structure of FIG. 3 in a first top removal phase.

Referring now to FIG. 4, therein is shown the structure of FIG. 3 in a first top removal phase. The first top removal phase can include a removal process. For example, the first top removal phase can include etching, stamping, or grinding.

Also for example, the first top removal phase can include a masking process to cover portions of the carrier 302 before the removal process is performed.

A portion at the carrier top side 306 can be partially removed forming a first partially removed region 402. The first partially removed region 402 defines a first carrier top portion 404 and a second carrier top portion 406.

Figure 5:
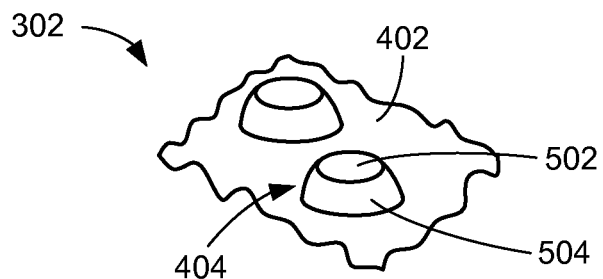
FIG. 5 is an isometric top view of a portion of the carrier.

Referring now to FIG. 5, therein is shown an isometric top view of a portion of the carrier 302. The isometric top view depicts a number of the first carrier top portion 404 extending above the first partially removed region 402.

The first carrier top portion 404 can include a first portion top side 502. For illustration purposes, the first portion top side 502 is shown as circular shape, although it is understood that the first portion top side 502 can include any shape. For example, the first portion top side 502 can include a rectangular shape.

The first carrier top portion 404 can include a first portion non-horizontal side 504, which is defined as a lateral side of the first carrier top portion 404. The first portion non-horizontal side 504 extends between the first portion top side 502 and the first partially removed region 402.

For illustration purposes, the first portion non-horizontal side 504 is shown with a planar or flat surface, although it is understood that the first portion non-horizontal side 504 can include a non-planar surface. For example, the first portion non-horizontal side 504 can include a curve surface. For a specific example, the first portion non-horizontal side 504 can include a concave surface.

For illustration purposes, the isometric top view depicts only the first carrier top portion 404, although it is understood that the second carrier top portion 406 of FIG. 4 can include similar structures or examples as the first carrier top portion 404 does. For example, the second carrier top portion 406 can include a top side and a non-horizontal side that have similar structures or examples as the first portion top side 502 and the first portion non-horizontal side 504 do, respectively.

Figure 6:
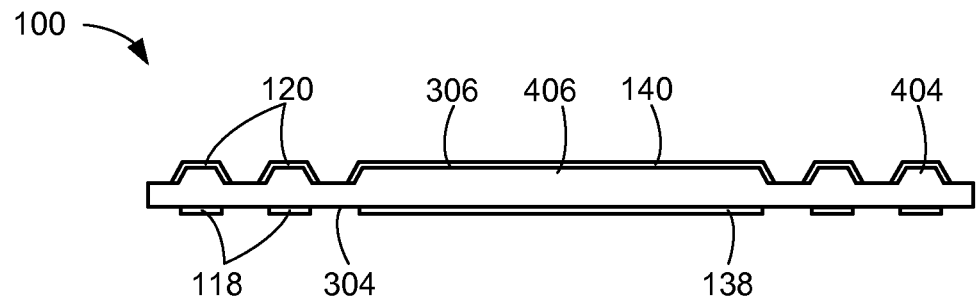
FIG. 6 is the structure of FIG. 4 in a plating phase.

Referring now to FIG. 6, therein is shown the structure of FIG. 4 in a plating phase. The plating phase can include a masking process, a plating process, or a combination thereof. For example, the plating process can include a selective plating process.

The plating process can be used to form the lead conductive layer 118 and the paddle conductive layer 138 at the carrier bottom side 304. The plating process can be used to form the lead conductive cap 120 and the paddle conductive cap 140 at the carrier top side 306. The lead conductive layer 118, the lead conductive cap 120, the paddle conductive layer 138, and the paddle conductive cap 140 can be formed with a plated build-up layer of a conductive material.

For example, the lead conductive layer 118, the lead conductive cap 120, the paddle conductive layer 138, or the paddle conductive cap 140 can be formed with a conductive material including nickel (Ni), palladium (Pd), gold (Au), copper (Cu), or a combination thereof. For a specific example, the lead conductive layer 118, the lead conductive cap 120, the paddle conductive layer 138, or the paddle conductive cap 140 can be formed with nickel-palladium-gold (Ni—Pd—Au).

The lead conductive layer 118 and the paddle conductive layer 138 can be formed below the lead conductive cap 120 and the paddle conductive cap 140, respectively. The lead conductive cap 120 and the paddle conductive cap 140 can be formed or plated directly on the first carrier top portion 404 and the second carrier top portion 406, respectively.

For example, the lead conductive layer 118, the lead conductive cap 120, the paddle conductive layer 138, and the paddle conductive cap 140 can be formed with masking or resist materials. For a specific example, the lead conductive layer 118, the lead conductive cap 120, the paddle conductive layer 138, and the paddle conductive cap 140 can be formed with a dry film resist.

Figure 7:
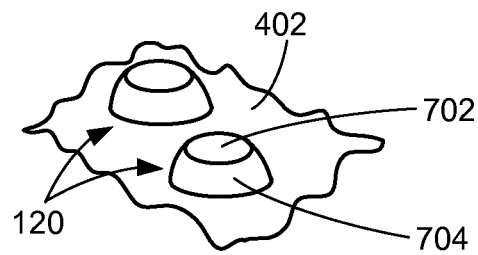
FIG. 7 is an isometric top view of the lead conductive cap.

Referring now to FIG. 7, therein is shown an isometric top view of the lead conductive cap 120. The isometric top view depicts a number of the lead conductive cap 120 extending above the first partially removed region 402.

The lead conductive cap 120 can include a lead cap top side 702. The lead cap top side 702 can be completely covering or directly on the first portion top side 502 of FIG. 5, which will represent the lead top side 106 of FIG. 1 upon completion of manufacture of the integrated circuit packaging system 100 of FIG. 1.

For illustration purposes, the lead cap top side 702 is shown as circular shape, although it is understood that the lead cap top side 702 can include any shape. For example, the lead cap top side 702 can include a rectangular shape.

The lead conductive cap 120 can include a lead cap non-horizontal side 704, which is defined as a lateral side of the lead conductive cap 120. The lead cap non-horizontal side 704 extends between the lead cap top side 702 and the first partially removed region 402. The lead cap non-horizontal side 704 can be completely covering or directly on the first portion non-horizontal side 504 of FIG. 5, which will represent the lead overhang non-horizontal side 112 of FIG. 1 upon completion of manufacture of the integrated circuit packaging system 100.

For illustration purposes, the lead cap non-horizontal side 704 is shown with a planar or flat surface, although it is understood that the lead cap non-horizontal side 704 can include a non-planar surface. For example, the lead cap non-horizontal side 704 can include a curve surface. For a specific example, the lead cap non-horizontal side 704 can include a concave surface.

For illustration purposes, the isometric top view depicts only the lead conductive cap 120, although it is understood that the paddle conductive cap 140 of FIG. 1 can include similar structures or examples as the lead conductive cap 120 does. For example, the paddle conductive cap 140 can include a top side and a non-horizontal side that have similar structures or examples as the lead cap top side 702 and the lead cap non-horizontal side 704 do, respectively.

Figure 8:
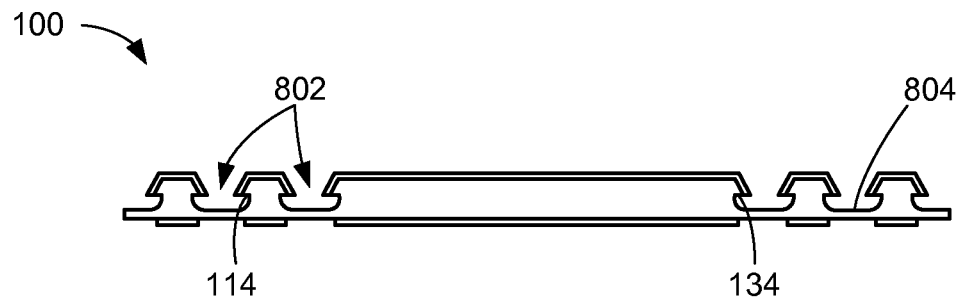
FIG. 8 is the structure of FIG. 6 in a second top removal phase.

Referring now to FIG. 8, therein is shown the structure of FIG. 6 in a second top removal phase. The second top removal phase can include a removal process. For example, the second top removal phase can include a removal process including etching. For a specific example, the second top removal phase can include second ($2^{nd}$) level alkali etching.

A portion of the first partially removed region 402 of FIG. 4 can be partially removed forming a second partially removed region 802. The second partially removed region 802 defines the lead overhang-undercut side 114 and the paddle overhang-undercut side 134.

For illustration purposes, the lead overhang-undercut side 114 is shown as planar or flat, although it is understood that the lead overhang-undercut side 114 can include a non-planar surface. For example, the lead overhang-undercut side 114 can include a curve surface. For a specific example, the lead overhang-undercut side 114 can include a concave surface.

For illustration purposes, the paddle overhang-undercut side 134 is shown as planar or flat, although it is understood that the paddle overhang-undercut side 134 can include a non-planar surface. For example, the paddle overhang-undercut side 134 can include a curve surface. For a specific example, the paddle overhang-undercut side 134 can include a concave surface.

For illustration purposes, a second region top surface 804 of the second partially removed region 802 is shown as planar or flat, although it is understood that the second region top surface 804 can include a non-planar surface. For example, the second region top surface 804 can include a curve surface. For a specific example, the second region top surface 804 can include a concave surface.

Figure 9:
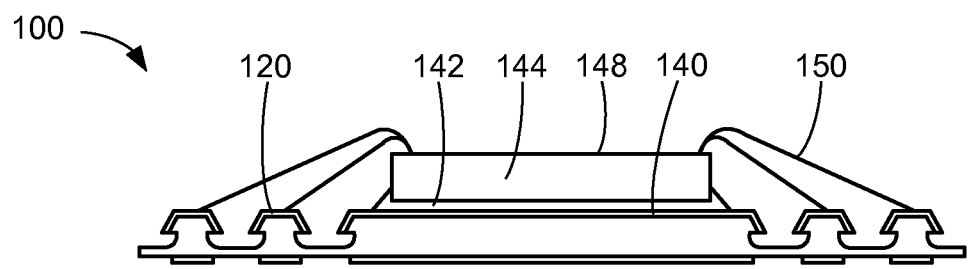
FIG. 9 is the structure of FIG. 8 in an attaching phase.

Referring now to FIG. 9, therein is shown the structure of FIG. 8 in an attaching phase. For example, the attaching phase can include an attachment process and a package assembly process to produce an assembled package before a removal process occurs in a subsequent phase. For a specific example, the attachment process can include a die attach process and a wirebond process.

The integrated circuit packaging system 100 can include the integrated circuit 144 attached to the paddle conductive cap 140 with the attach layer 142. A peripheral area at the active side 148 of the integrated circuit 144 can be electrically connected to the lead conductive cap 120 with the electrical connector 150.

For illustration purposes, the integrated circuit 144 is shown as a wirebond integrated circuit, although it is understood that the integrated circuit 144 can be any semiconductor device. For example, the integrated circuit 144 can be a semiconductor device including a flip chip.

For illustration purposes, the electrical connector 150 is shown as a bond wire, although it is understood that the electrical connector 150 can represent any electrical connector. For example, the electrical connector 150 can represent a conductive bump, a conductive column, or a conductive stud.

Figure 10:
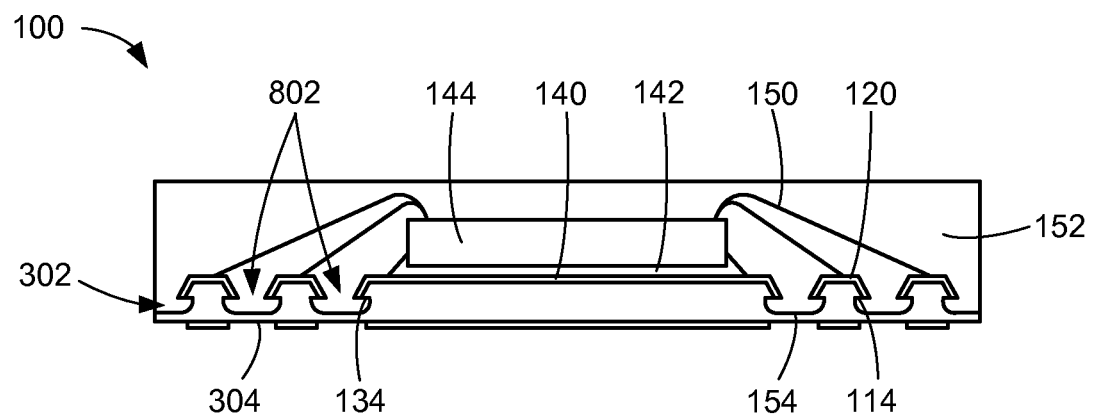
FIG. 10 is the structure of FIG. 9 in a molding phase.

Referring now to FIG. 10, therein is shown the structure of FIG. 9 in a molding phase. The molding phase can include a molding process to form the encapsulation 152 on the carrier 302 at the second partially removed region 802.

The encapsulation 152 can be formed on the lead conductive cap 120, the paddle conductive cap 140, the attach layer 142, the integrated circuit 144, and the electrical connector 150. The encapsulation 152 can be formed under or directly on the lead overhang-undercut side 114 and the paddle overhang-undercut side 134 providing mold interlock to prevent lead and paddle pullouts.

The encapsulation bottom side 154 can be formed extending between the lead ridge 116 of FIG. 1 and the paddle ridge 136 of FIG. 1. The encapsulation bottom side 154 can be formed extending between the lead ridge 116 and another of the lead ridge 116.

For illustration purposes, the encapsulation bottom side 154 is shown as a planar or flat surface, although it is understood that the encapsulation bottom side 154 can include a non-planar surface. For example, the encapsulation bottom side 154 can include a curve surface. For a specific example, the encapsulation bottom side 154 can include a convex surface or a bulge at the encapsulation bottom side 154 with the encapsulation bottom side 154 extending from and below the lead ridge 116 or the paddle ridge 136.

In a subsequent phase, a removal process and a singulation process can be performed to form the integrated circuit packaging system 100. The removal process can be used to partially remove the carrier 302 at the carrier bottom side 304 to form the lead 102 of FIG. 1 and the package paddle 122 of FIG. 1. For example, the removal process can include etching. For a specific example, the removal process can include copper alkali back-etching.

Figure 11:
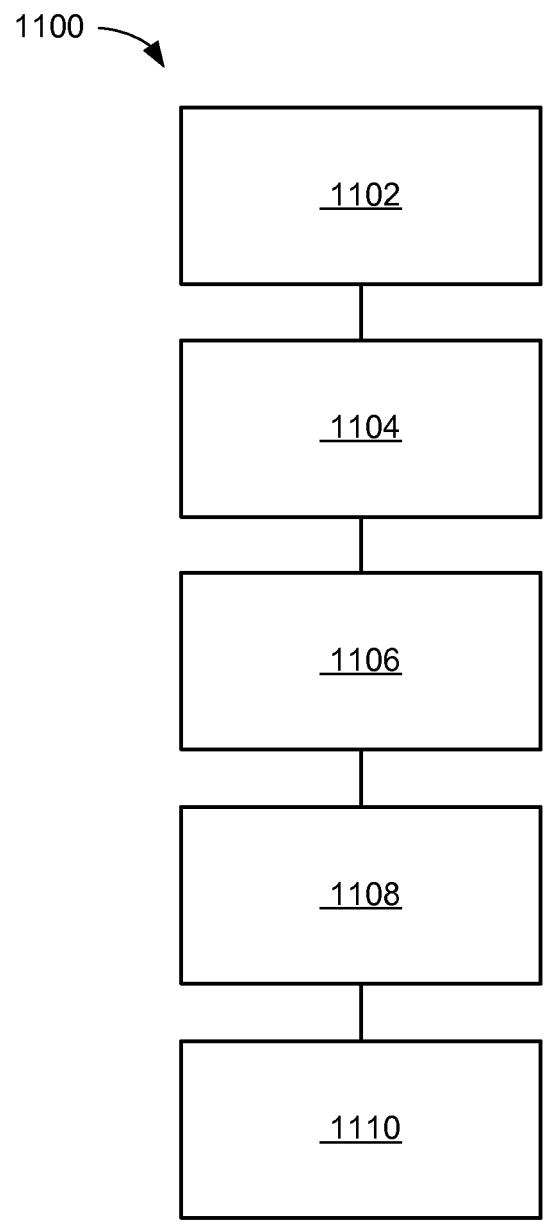
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: forming a lead having a lead overhang at an obtuse angle to a lead top side and having a lead ridge protruding from a lead non-horizontal side, the lead overhang having a lead overhang-undercut side at an acute angle to a lead overhang non-horizontal side in a block 1102; forming a lead conductive cap completely covering the lead overhang non-horizontal side and the lead top side in a block 1104; forming a package paddle adjacent the lead in a block 1106; mounting an integrated circuit over the package paddle in a block 1108; and forming an encapsulation over the integrated circuit, the package paddle, and the lead in a block 1110.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

forming a lead having a lead top side, a bottom side, a lead overhang and a lead ridge, the lead overhang having a non-horizontal side, an overhang-undercut side and the overhang non-horizontal side being at an obtuse angle to the lead top side, the overhang-undercut side being at an acute angle to the overhang non-horizontal side, and the overhang non-horizontal side and the overhang-undercut side forming an apex at the ends thereof;

the lead ridge protruding from the lead bottom side and having upper and lower concave surfaces;

the lead having a width continuously increasing from the lead top side to the apex and continuously decreasing from the apex to the upper concave surface of the ridge;

forming a lead conductive cap completely covering the lead top side and the lead overhang non-horizontal side, without covering the lead overhang-undercut side and the concave surfaces of the ridge;

forming a package paddle having a top side and a bottom side adjacent the lead;

mounting an integrated circuit over the top side of the package paddle;

attaching an electrical connector to the integrated circuit and the lead conductive cap; and forming an encapsulation over the integrated circuit and partially over the package paddle and the lead exposing the bottom sides of the package paddle and the lead.

2. The method as claimed in claim 1 wherein forming the encapsulation includes forming the encapsulation under the lead overhang-undercut side.

3. The method as claimed in claim 1 wherein:

forming the package paddle includes forming the package paddle having a paddle overhang-undercut side; and forming the encapsulation includes forming the encapsulation under the paddle overhang-undercut side.

\* \* \* \* \*